(12) United States Patent
Moeller et al.

(10) Patent No.: US 11,231,475 B2
(45) Date of Patent: Jan. 25, 2022

(54) SCALABLE SELF-CALIBRATED INTERPOLATION OF UNDERSAMPLED MAGNETIC RESONANCE IMAGING DATA

(71) Applicant: REGENTS OF THE UNIVERSITY OF MINNESOTA, Minneapolis, MN (US)

(72) Inventors: Steen Moeller, Minneapolis, MN (US); Mehmet Akcakaya, Minneapolis, MN (US); Seng-Wei Chieh, Minneapolis, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 0 days.

(21) Appl. No.: 16/853,308

(22) Filed: Apr. 20, 2020

(65) Prior Publication Data
US 2020/0333416 A1 Oct. 22, 2020

Related U.S. Application Data

(60) Provisional application No. 62/836,333, filed on Apr. 19, 2019, provisional application No. 62/838,446, filed on Apr. 25, 2019.

(51) Int. Cl.
| G01R 33/56 | (2006.01) |
| G01R 33/561 | (2006.01) |
| G01R 33/565 | (2006.01) |
| G01R 33/58 | (2006.01) |
| G01R 33/48 | (2006.01) |

(52) U.S. Cl.
CPC ..... *G01R 33/5608* (2013.01); *G01R 33/4824* (2013.01); *G01R 33/561* (2013.01); *G01R 33/56545* (2013.01); *G01R 33/583* (2013.01)

(58) Field of Classification Search
CPC .......... G01R 33/5608; G01R 33/56545; G01R 33/583; G01R 33/4824
See application file for complete search history.

(56) References Cited

U.S. PATENT DOCUMENTS

| 2015/0285879 A1* | 10/2015 | Hilbert ............... G01R 33/5619 324/309 |
| 2019/0195975 A1* | 6/2019 | Liu .................... G01R 33/4818 |
| 2020/0319283 A1* | 10/2020 | Wang ................. G01R 33/5608 |

OTHER PUBLICATIONS

Beatty P, et al. Rapid gridding reconstruction with a minimum oversampling ratio. IEEE Trans Med Imaging. 2005;24(6):799-808.
Brau Ac, et al. Comparison of reconstruction accuracy and efficiency among autocalibrating data-driven parallel imaging methods. Magn Reson Med 2008;59(2):382-395.
Breuer Fa, et al. Controlled aliasing in volumetric parallel imaging (2D CAIPIRINHA). Magn Reson Med 2006;55(3):549-556.
(Continued)

*Primary Examiner* — G. M. A Hyder
(74) *Attorney, Agent, or Firm* — Quarles & Brady LLP

(57) ABSTRACT

A fully sampled calibration data set, which may be Cartesian k-space data, is used to obtain targeted and optimal interpolation kernels for non-regularly sampled data. The calibration data are self-calibration data obtained from a time-averaged image, or re-sampled data. ACS data are resampled for calibration of region-specific kernels. Subsequently, an explicit noise-based regularized solution can be utilized to estimate region-specific kernels for reconstruction.

36 Claims, 8 Drawing Sheets

(56) References Cited

OTHER PUBLICATIONS

Breuer Fa, et al. Dynamic autocalibrated parallel imaging using temporal GRAPPA (TGRAPPA). Magn Reson Med. 2005;53:981-985.
Chang Y, et al. Nonlinear GRAPPA: a kernel approach to parallel MRI reconstruction. Magn Reson Med. 2012;68:730-740.
Chieh S, et al. A scalable composite through-time radial GRAPPA method. ISMRM 2017; p. 1045.
Liang D, et al. Accelerating SENSE using compressed sensing. Magn Reson Med. 2009;62:1574-1584.
Lin Fh. Prior-regularized GRAPPA reconstruction. Proceedings of the 14th annual meeting of ISMRM p. 3656; 2006 Seattle, WA.
Lingala Sg, et al. Feasibility of through-time spiral generalized autocalibrating partial parallel acquisition for low atency accelerated real-time MRI of speech. Magn Reson Med. 2017;78(6):2275-2282.
Luo T, et al. A fast and general non-Cartesian GRAPPA reconstruction method. ISMRM 2018; p. 2821.
Luo T, et al. A Grappa algorithm for arbitrary 2D/3D non-Cartesian sampling trajectories with rapid calibration. Magn Reson Med. 2019;82:1101-1112.
Mani, M., et al. 2017. Multi-shot sensitivity-encoded diffusion data recovery using structured low-rank matrix completion (MUSSELS). Magn Reson Med 78, 494-507.
Moeller S, et al. Multi-scale locally low-rank noise reduction for high-resolution dynamic quantitative cardiac MRI. EMBC. 2017;1473-1476.
Moeller S et al. fMRI at Ultra High Field (7T) with GRAPPA and Sense. ISMRM 2006:291.
Moeller, S., et al. 2008. fMRI with 16 fold reduction using multibanded multislice sampling. Proc Int Soc Mag Reson Med 16, 2366.
Otazo R, et al. Low-rank and sparse matrix decomposition for accelerated dynamic MRI with separation of background and dynamic components. Magn Reson Med. 2015;73(3):1125-1136.
Pruessmann KP, et al. Advances in sensitivity encoding with arbitrary k-space trajectories. Magn Reson Med. 2001;46(4):638-651.
Pruessmann KP, et al. SENSE: sensitivity encoding for fast MRI. Magn Reson Med 1999;42(5):952-962.
Qu P, et al. Discrepancy-based adaptive regularization for GRAPPA reconstruction. J Magn Reson Imaging. 2006;24:248-255.
Sayin O, et al. Real-time free-breathing cardiac imaging with self-calibrated through-time radial GRAPPA. Magn Reson Med. 2017;77(1):250-264.
Seiberlich N, et al. Improved radial GRAPPA calibration for real-time free-breathing cardiac imaging. Magn Reson Med. 2011;65(2):492-505.
Seiberlich N, et al. Non-Cartesian data reconstruction using GRAPPA operator gridding (GROG). Magn Reson Med. 2007;58:1257-1265.
Seiberlich N, et al. Self-calibrating GRAPPA operator gridding for radial and spiral trajectories. Magn Reson Med. 2008;59:930-935.
Seiberlich N, et al. Using the GRAPPA operator and the generalized sampling theorem to reconstruct undersampled non-Cartesian data. Magn Reson Med. 2009;61(3):705-715.
Seisompop K, et al. High-resolution in vivo diffusion imaging of the human brain with generalized slice dithered enhanced resolution: Simultaneous multislice (gSlider-SMS). Magn Reson Med 2017.
Trzasko J, et al. Local versus global low-rank promotion in dynamic MRI series reconstruction. In Proceedings of 19th annual meeting of ISMRM p. 4371; 2011; Montreal, Canada.
Uecker M, et al. ESPIRiT—An eigenvalue approach to autocalibrating parallel MRI: where SENSE meets GRAPPA. Magn Reson Med. 2014; 71(3):990-1001.
Yeh En, et al. Parallel magnetic resonance imaging with adaptive radius in k-space (APRS): constrained image reconstruction using k-space locality in radiofrequency coil encoded data Magn Reson Med. 2005;53:1383-1392.

\* cited by examiner

SCALABLE SELF-CALIBRATED INTERPOLATION OF UNDERSAMPLED MAGNETIC RESONANCE IMAGING DATA

CROSS-REFERENCE TO RELATED APPLICATIONS

This application claims the benefit of U.S. Provisional Patent Application Ser. No. 62/836,333, filed on Apr. 19, 2019, and entitled "SCALABLE SELF-CALIBRATED INTERPOLATION OF UNDERSAMPLED MAGNETIC RESONANCE IMAGING DATA," and U.S. Provisional Patent Application Ser. No. 62/838,446, filed on Apr. 25, 2019, and entitled "METHODS FOR ESTIMATING AND IMPLEMENTING REGION-SPECIFIC K-SPACE INTERPOLATION KERNELS," both of which are herein incorporated by reference in their entirety.

STATEMENT REGARDING FEDERALLY SPONSORED RESEARCH

This invention was made with government support under EB015894 and HL111410 awarded by National Institutes of Health, and CCF-1651825 awarded by the National Science Foundation. The government has certain rights in the invention.

BACKGROUND

Non-Cartesian undersampled acquisition for parallel imaging is commonly reconstructed using CG-SENSE type methods. Methods of k-space interpolation can also be used, but it is challenging to acquire sufficient number of identical patches of an undersampled patch for determining interpolation kernels and applying it to recover missing data. Region-specific kernels can be calibrated from repeatedly acquired fully sampled calibration scans, and provides reconstruction improvement because of better match with the theoretical model, but with the cost of large number of calibration scans.

SUMMARY OF THE DISCLOSURE

The present disclosure addresses the aforementioned drawbacks by providing a method for producing an image of a subject with a magnetic resonance imaging (MRI) system. Undersampled k-space data are acquired with an MRI system using a radio frequency (RF) coil array having a plurality of coils. The undersampled k-space data sample k-space along at least one non-Cartesian trajectory. Composite data are generated from the undersampled k-space data, and regridded data are generated from the composite data by regridding at least some of the composite data to a Cartesian grid. A region-specific interpolation kernel (RIK) geometry is determined and calibration data are generated by resampling the regridded data using the RIK geometry. Reconstruction kernels are computed from the calibration data and an image of the subject is then reconstructed from the undersampled k-space data using the computed reconstruction kernels to synthesize additional k-space data.

It is another aspect of the present disclosure to provide a method for producing an image of a subject with an MRI system. Undersampled k-space data are acquired with an MRI system using an RF coil array having a plurality of coils. In some implementations, the undersampled k-space data sample k-space along at least one Cartesian trajectory. In some other implementations, the undersampled k-space data sample k-space using random sampling on Cartesian points. A RIK geometry is determined and calibration data are generated using the RIK geometry. Reconstruction kernels are computed from the calibration data and an image of the subject is then reconstructed from the undersampled k-space data using the computed reconstruction kernels to synthesize additional k-space data.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Described here are systems and methods for reconstructing images from undersampled k-space data using self-calibrated region-specific interpolation kernels ("RIK") for highly accelerated acquisitions. In general, these kernels are calibrated using a fully sampled calibration data set, which may be Cartesian k-space data, that is generated from undersampled k-space data. In some instances, the Cartesian k-space data can be obtained from a time-averaged image, or re-sampled data.

As one non-limiting example, RIKs are self-calibrated using dynamic undersampled k-space data while also accomplishing reconstruction at high acceleration rates to improve the efficiency of calibration scanning. The technique, which can be referred to as a self-calibrated interpolation of non-Cartesian data with GRAPPA ("SING"), synthesizes target and source points on repeated sampling patterns with a distinct shape of each RIK geometry in order to eliminate the acquisition of additional calibration data. As described below, the methods are also applicable to undersampled k-space data that sampled k-space along one or more Cartesian trajectories, or using a random sampling on Cartesian points. Conventional non-Cartesian parallel imaging reconstruction in k-space necessitates large amounts of calibration data for successful estimation of RIKs. The systems and methods described in the present disclosure provide a self-calibration strategy for obtaining region-specific non-Cartesian interpolation kernels from a single calibration dataset. This approach enables simple and efficient high-quality reconstruction of non-Cartesian parallel imaging.

Figures 1A, 1B, 1C, 1D, 1E:
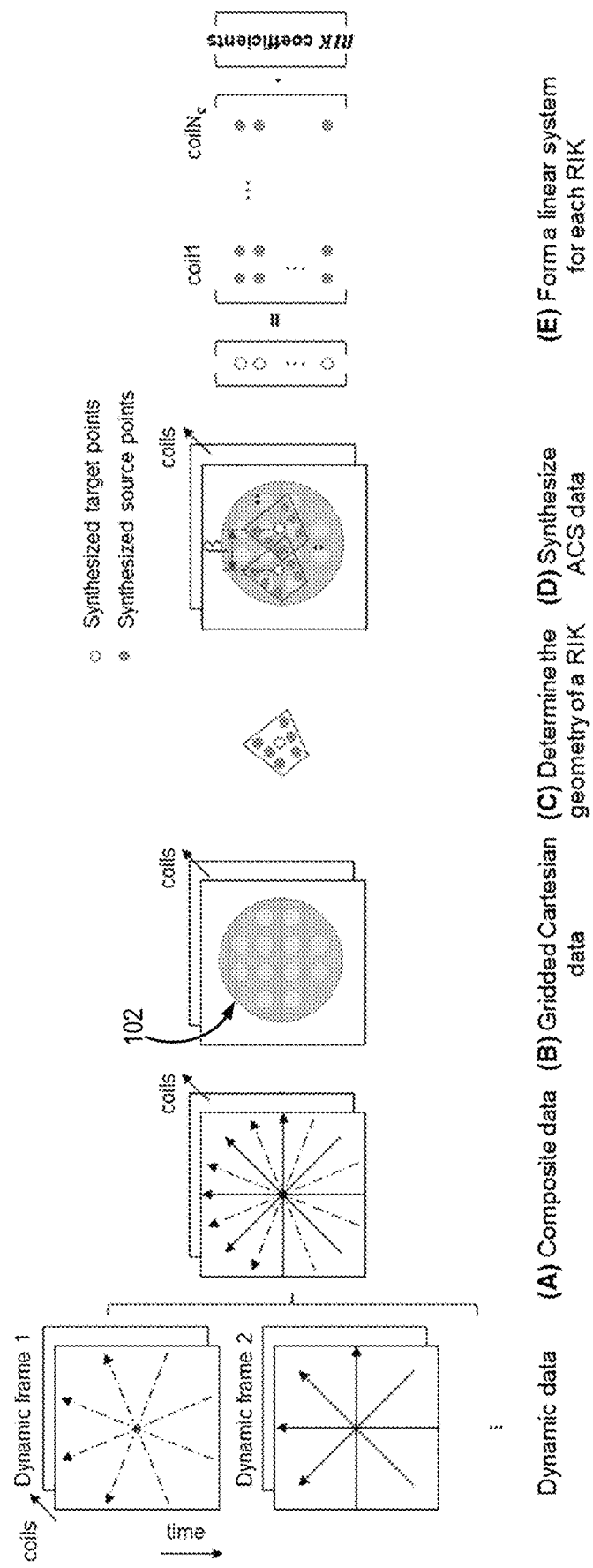
FIGS. 1A-1E show a workflow of an example method for calibrating a region-specific kernel and applying it for data interpolation.

In general, the SING technique synthesizes target and source points on shift-invariant patterns with a distinct shape for each RIK geometry in order to establish a distinct linear overdetermined system based on the shift-invariant property of GRAPPA interpolation. An example of this process is illustrated in FIGS. 1A-1E. First, undersampled k-space data (e.g., dynamic accelerated data) are combined into composite data (FIG. 1A). The composite data are transformed to image space using gridding reconstruction and then transformed back to generate gridded Cartesian data via inverse Fourier transform (FIG. 1B). For instance, the composite image on each coil can be reconstructed coil-by-coil using a gridding reconstruction and, subsequently, each coil image can be inverse Fourier transformed to obtain centrally located gridded Cartesian points for each coil. In FIG. 1B, the central region 102 with Cartesian points has a radius of $\alpha \cdot N_{readout} \cdot \Delta k$, where $N_{readout}$ is the number of total readouts in each radial view and $\Delta k$ is the Nyquist sampling interval in k-space. The constant, $\alpha$ can be set to a suitable value. In one example study, several values of (e.g., $\alpha \in \{1/10, 1/8, 1/6, 1/4\}$) were empirically studied and $\alpha$ was set to $1/6$ empirically based on visual inspection of reconstructed images corresponding to different values.

Figure 2:
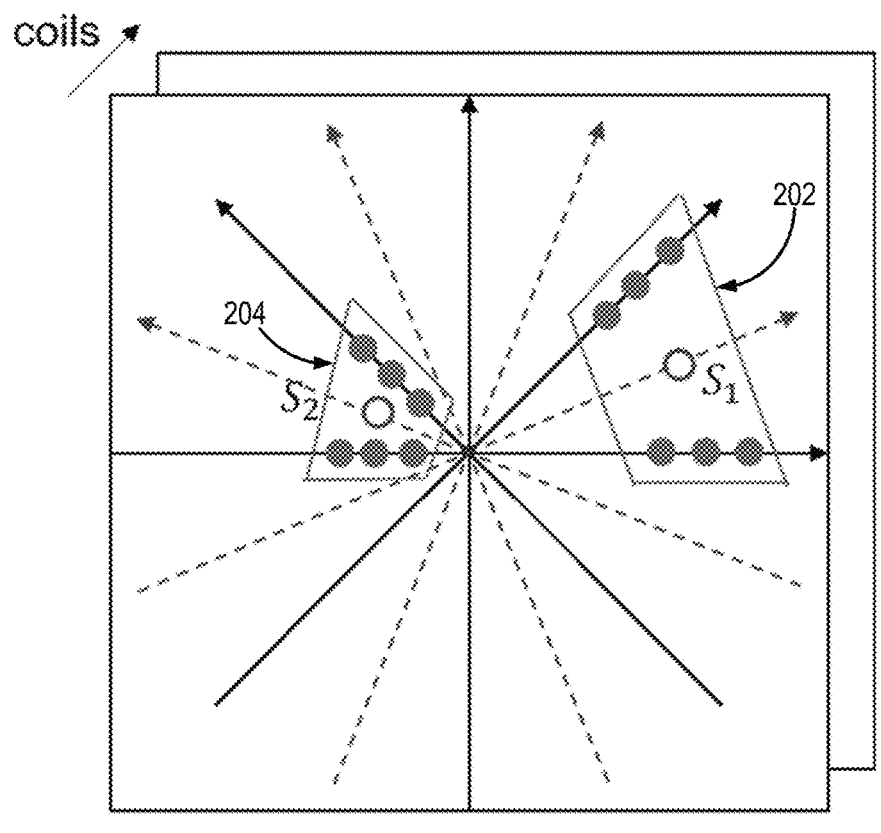
FIG. 2 shows example of region-specific interpolation kernel ("RIK") geometries.

The shape of the sampling pattern for each RIK is determined or otherwise selected (FIG. 1C). Two different example RIKs 202, 204 are shown in FIG. 2. Each missing sample is reconstructed from the linear combination of each RIK weighted acquired samples. In the radial trajectory, the shapes of sampling patterns in different regions are different.

For each RIK geometry, the gridded Cartesian data are then convolved with a function and sampled on the repeated sampling patterns with the determined shape of each RIK to synthesize target and source points (FIG. 1D). As an example, the gridded Cartesian can be convolved with the same optimized Kaiser-Bessel function as the one utilized in the gridding reconstruction, which yields lowest maximum aliasing amplitude at any point of the gridding reconstructed image. As one non-limiting example, the radius can be equal to the Nyquist sampling rate. As another non-limiting example, the data within the radius of the width of the gridding function can be excluded.

As noted, the convolved data are sampled onto target and source points (i.e., ACS data points) on the shift-invariant patterns with the shape of the RIK. As an example, the pattern of the RIK is shifted by an amount, $\beta$, along the $k_x$ and $k_y$ directions over the central k-space region. Two neighboring patterns are depicted in FIG. 1D. The value of $\beta$ affects the conditioning of the linear calibration system, which is established from these patterns. To establish a well-conditioned system, $\beta$ can be chosen to be larger than the width of the function (e.g., the Kaiser-Bessel function) that is convolved with the gridded Cartesian points. If the distance is smaller than the function width, the convolution results in correlation between adjacent sampling patterns and the system will be different from the properties of the acquired data.

Figure 3:
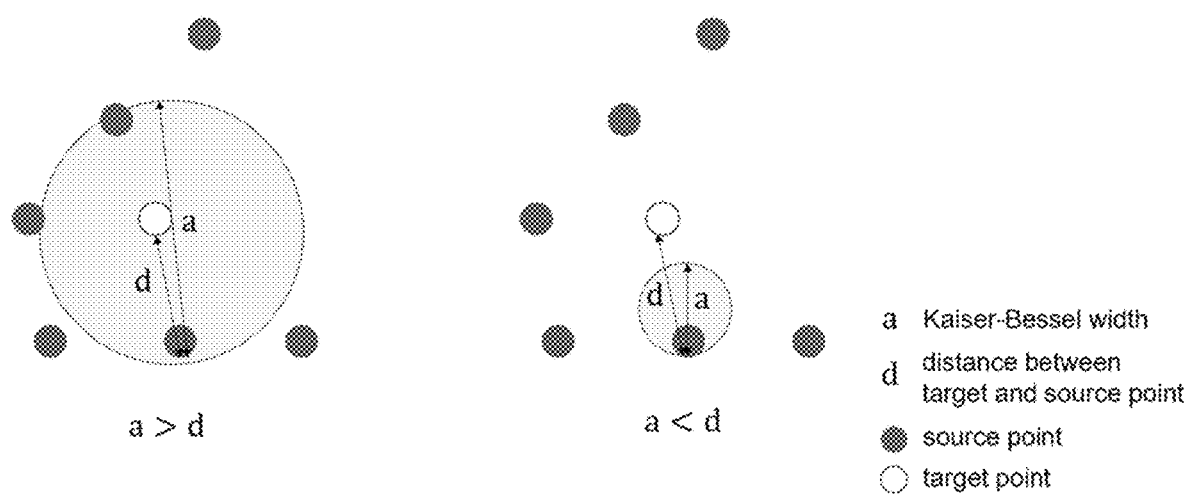
FIG. 3 shows example of shift-invariant patterns of RIKs generated using different widths of a Kaiser-Bessel function.

In addition to the correlation between different patterns, the convolution with the selected function may in some instances generate source-to-target correlations in each pattern that are different from the correlation generated by the multi-coil encoding. The source-to-target correlation due to the convolution with the selected function (e.g., a Kaiser-Bessel function) can be eliminated to ensure the target and source points are only correlated by the multi-coil encoding. An example of this convolution effect is illustrated in FIG. 3. To eliminate the convolution effect, the width of the same function is chosen to be smaller than the minimum distance between the target and source points in each pattern. When the function width, a (e.g., the Kaiser-Bessel function width) is greater than the distance between target and source points, d, the synthesized target and source points are correlated by convolution with the function. Synthesized target and source points are then correlated by both multi-coil encoding and convolution, causing perturbation due to convolution on estimated RIK. On the other hand, when a<d, the synthesized target and source points are correlated only by multi-coil encoding, eliminating perturbation due to convolution on estimated RIK.

Referring again to FIGS. 1A-1E, the synthesis of ACS data points is repeated for each RIK until all missing samples of the undersampled scan are reconstructed. The synthesized target and source points are utilized to establish a linear system for each RIK (FIG. 1E). The system can in some instances be regularized, such as by using a locality regularization as described below, and solved (e.g., via regularized least-squares) to estimate the RIK coefficients.

As an example, for each RIK, the calibration system can be represented by, $$\underset{x}{\operatorname{argmin}} \|b - A \cdot x\|_2^2; \quad (1)$$

where b is an M×1 vector of synthesized target points, A is an M×N matrix of synthesized source points, and x is an N×1 vector of the RIK coefficients. The RIK coefficients can be estimated via least-squares solution of the system.

At high acceleration rates, the estimation of RIK coefficients can suffer from inversion error when estimating them via least-squares and this error can then yield noise amplification in image reconstruction. Tikhonov regularization has been utilized to reduce the inversion error in the calibration of the RIK, but it can in some instances result in blurred artifacts in image reconstruction. Furthermore, tuning a regularization parameter using discrepancy principle or L-curve methods may require multiple calculations of matrix inversions. The computationally intense process can therefore be challenging to extend to RIK calibration in some instances.

In some example implementations, a local k-space regularization employing local signal-to-noise ratio ("SNR") level in k-space can be used, which has the advantage of eliminating computationally intense parameter tuning. The "signal" SNR in a RIK can be determined, for instance, as the L1 or L2 weighted combination across all channels and samples in the RIK. This proposed regularization operates by adding noise to the calibration system of each RIK.

Before adding noise, the system is given by as described in Eqn. (1). After adding noise, the system is represented as, $$\underset{x}{\arg\min}\|(b + \Delta b) - (A + \Delta A) \cdot x\|_2^2. \quad (2)$$

The variance of $\Delta b$ and $\Delta A$ can be determined to match the SNR between the synthesized ACS data points and the measured k-space samples in the local region where the calibrated RIK is applied for k-space interpolation. These parameters, $\Delta b$ and $\Delta A$, can be selected so that the synthetic ACS data points have matched SNR to the undersampled k-space data points in the local k-space region of each RIK.

Thus, as one example, $\Delta b$ and $\Delta A$ can be generated as, $$\Delta b = W \cdot \chi \quad (3);$$

$$\Delta A = W \cdot X \quad (4);$$

where $\chi$ and $X$ can be drawn from a standard normal distribution independently. The matrix, $W$, is an $M \times M$ diagonal weighting matrix with the diagonal entry, $w_m$, given by, $$w_m = \sigma \cdot \frac{a_m}{u}; \quad (5)$$

where $a_m$ is the average signal intensity of synthesized source points across all coils on the mth sampling pattern for each RIK, which as one example can be calculated with the L2-norm of these points across all channels; U is the average signal intensity of the measured k-space samples in the local region onto which the calibrated RIK is applied to interpolate missing data points; and $\sigma$ is the standard deviation of thermal noise, which can be estimated from the noise-only portion of one-dimensional Fourier transformed acquired radial spokes in the sinogram space.

In some implementations, the regularization for a RIK can be implemented for a finite set of noise-levels from the lowest to the highest. The regularization for the reconstruction kernel is then interpolated from these calculated regularization levels.

The coefficients of each RIK can be obtained through solving Eqn. (2) via least-squares or another suitable method. Each estimated RIK is then use to recover the missing data points in the local region of each RIK by linear combination of RIK-weighted neighboring acquired data points. The reconstructed, fully-sampled, k-space can then be transformed using gridding reconstruction to obtain the reconstructed image.

Apart from the self-calibration aspect of SING, the proposed local k-space regularization, which adapts to local signal information of the neighboring k-space undersampled data points in the local region of each RIK, also provides improvements in reconstruction quality.

Figure 4:
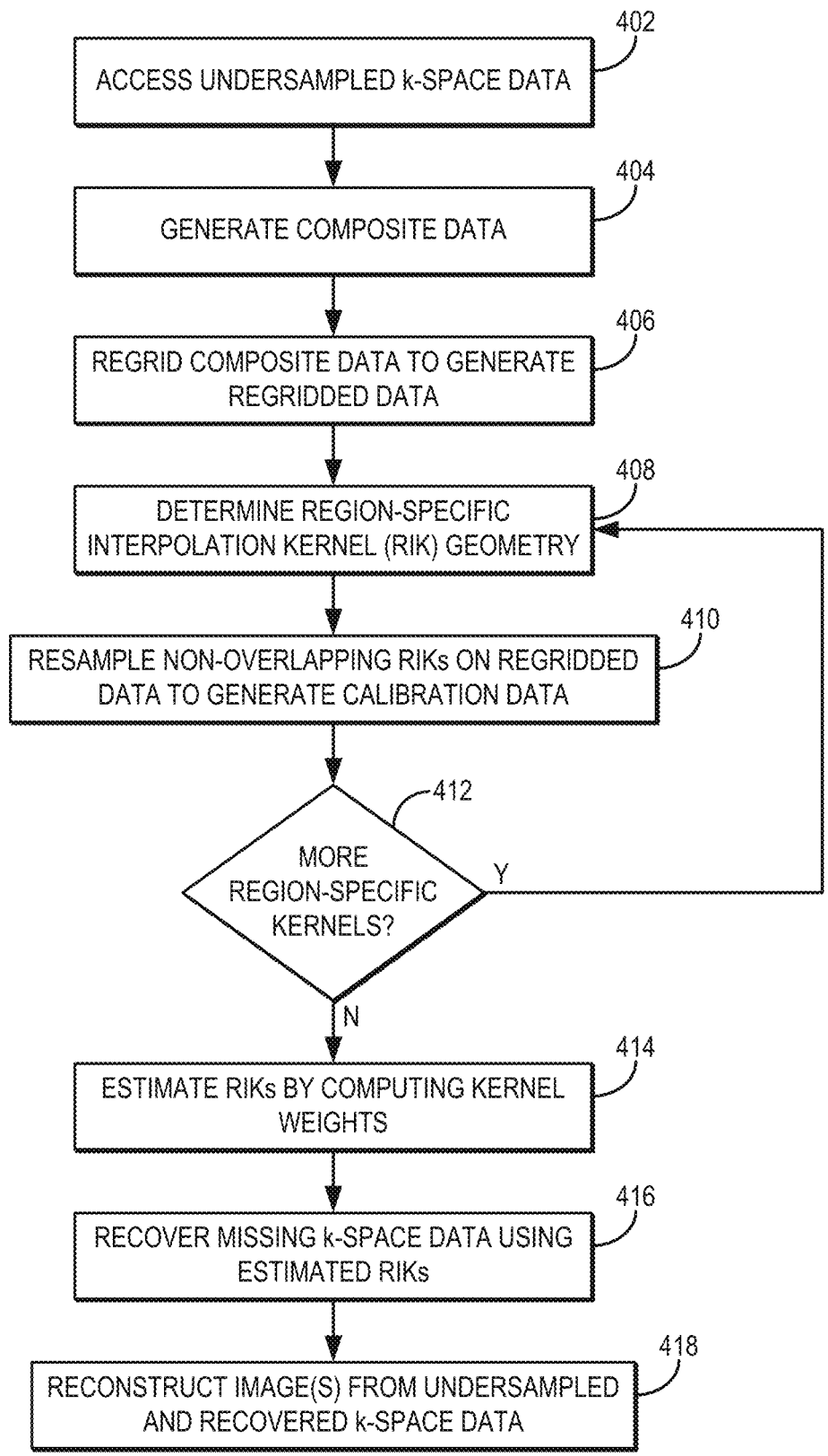
FIG. 4 is a flowchart setting forth the steps of an example method for reconstructing an image using a scalable self-calibrated interpolation of non-Cartesian data.

Referring now to FIG. 4, a flowchart is illustrated as setting forth the steps of one non-limiting example of a SING method for reconstructing an image from data acquired using an MRI system.

The method includes accessing undersampled k-space data, as indicated at step 402. Accessing the undersampled k-space data can include retrieving previously acquired data from a memory or other data storage device or medium. Additionally or alternatively, accessing the undersampled k-space data can include acquiring such data with an MRI system and communicating that data to the computer system, which may be a part of the MRI system. Preferably, the undersampled k-space data sample k-space along one or more non-Cartesian trajectories. In other implementations, the undersampled k-space data sample k-space along one or more Cartesian trajectories. In still other implementations, the undersampled k-space data sample k-space using a random sampling, which may include random sampling on Cartesian points. As one example, the undersampled k-space data can sample k-space along radial trajectories. The undersampled k-space data can be two-dimensional or three-dimensional, and can be undersampled along one direction or more than one direction.

The undersampled k-space data are combined next to form composite data, as indicated at step 404 and as described above. As one example, the composite data can be generated by combining some or all of the undersampled k-space data in the k-space domain. Alternatively, the composite data can be formed in the image domain. As one example of such an implementation, a composite image can be generated by first reconstructing initial coil images from some or all of the undersampled k-space data across the receiver channels used to acquire the undersampled k-space data. These initial images can then be combined to form the composite image. In some implementations, the initial images can be combined using a coil sensitivity-weighted combination. In these instances, coil sensitivity profiles are provided or otherwise estimated. The composite image can then be transformed to the k-space domain in order to generate composite data.

When the undersampled k-space data include non-Cartesian sampling patterns, all or a portion of the composite data is regridded onto a Cartesian grid to generate regridded data, as indicated at step 406 and as described above. As one example, the entirety of the composite data are regridded. As another example, only a central region of the composite data are regridded.

The sampling pattern for a given RIK is determined or selected, as indicated at step 408 and as described above. Examples of such RIK geometries are shown in FIG. 2. Using the selected RIK geometry, calibration data are generate from the composite data, or the regridded composite data, by resampling RIKs that match the selected RIK geometry, as indicated at step 410 and described above. The RIKs may in some instances be non-overlapping. In other instances, some or all of the RIKs may partially overlap. In general, the RIKs are spaced apart by $\beta$, as described above. The synthesis of calibration data points is repeated for each RIK until all missing samples of the undersampled scan are reconstructed, as indicated at decision block 412.

Kernel weights are then obtained through solving for the system defined or otherwise described by the calibration data and the RIKs, as indicated at step 414. For example, the systems in Eqns. (1) or (2) can be solved. As described above, in some implementations the system can be regularized by adding noise (e.g., i.i.d. Gaussian noise) to synthetic points on each equation in order to match the SNR of the RIK. As another example, a Tikhonov regularization can be used. In these instances, the Tikhonov value used for this regularization can include values obtained from a range of singular values, and each Tikhonov value can be a predetermined ratio relative to the largest singular value. In other instances, each Tikhonov value can be determined using an L-curve principle for balancing error propagation versus data fidelity, which can be angular, or independently determined radial and angular. For instance, the Tikhonov regularization parameter can be chosen in a readout-dependent manner and modelled by ($1/r^2$) as the theoretical SNR decay along the readout.

Each estimated RIK is then use to recover the missing data points in the local region of each RIK by linear combination of RIK weighted neighboring acquired data points, as indicated at step 416. Images can then be reconstructed from the reconstructed, fully-sampled, k-space data, as indicated at step 418. For instance, when the fully-sampled k-space data include non-Cartesian sampling patterns, the k-space data can be reconstructed using a gridding reconstruction to obtain the reconstructed image In an example study, cine cardiac MRI data were acquired using a 30-channel body array with a GRE sequence. Imaging parameters were as follows: TE/TR/α=2.3 ms/3.9 ms/12°, bandwidth=440 Hz/pixel, resolution=2×2 mm², temporal resolution=45 ms. Data were fully sampled with 216 views using a linear view order in a single breath hold. The data were retrospectively undersampled uniformly for each cardiac phase, which was rotationally shifted between successive phases by the angle of a single view)(180°/216=0.83°.

In this example study, SING was able to produce reconstructed images with similar quality to a through-time GRAPPA ("TT-GRAPPA") technique, without needing the separate calibration acquisitions required of TT-GRAPPA. The self-calibration strategy described in the present disclosure has the potential to scale up to other trajectories and to 3D non-Cartesian imaging because it does not require additional calibration volumes, which is especially prohibitive in 3D acquisitions.

For instance, SING may be extended to complicated 3D sampling trajectories, such as a kooshball trajectory, because of the use of self-calibration. The kooshball trajectory provides advantages such as high isotropic resolution, wide spatial coverage, mild undersampling artifacts, reduced sensitivity to motion, and self-navigation properties. Due to the prolonged scan time of kooshball acquisitions, undersampled acquisitions are often performed.

As one non-limiting example, a 2D and/or 3D implementation of SING may utilize a virtual coil concept ("VCC"). In parallel imaging, the image reconstruction typically can be represented with the linear system with sensitivity encoding:

$$y = Ex \quad (6);$$

where y is a M×1 vector of measurements in all channels, E is an M×N matrix of sensitivity encoding, and x is an N×1 vector of an image. Given the multi-channel measurements y, solving Eqn. (6) for x can obtain a reconstructed image.

Combining the linear system with a VCC, additional virtual measurements can be augmented to the system, resulting in higher SNR in the system and an improved solution, x (i.e., an improved image). With the combination with VCC, Eqn. (6) is formulated as:

$$\begin{bmatrix} y \\ y^* \end{bmatrix} = \begin{bmatrix} E \\ E^* \end{bmatrix} \cdot x; \quad (7)$$

where y* is an M×1 vector of virtual measurements in all channels and E* is an M×N matrix of sensitivity encoding corresponding to virtual measurements, y*.

Solving Eqn. (7) can be performed with image-based (e.g., VCC-SENSE) or k-space (e.g., VCC-GRAPPA) reconstructions. In an image-based reconstruction, a least-squares solution is typically calculated to obtain an image. In a k-space reconstruction, the k-space is fully reconstructed with convolution interpolation kernels and Fourier transform is then applied to obtain an image.

Figure 5:
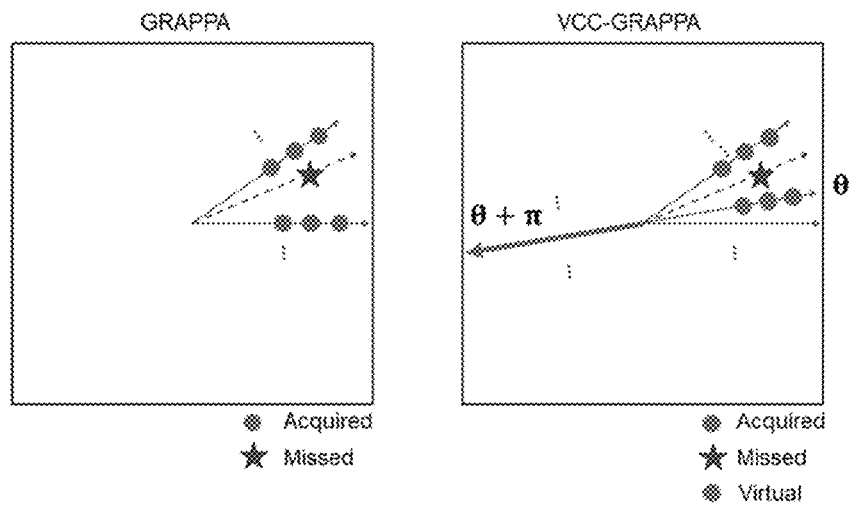
FIG. 5 illustrates example GRAPPA and VCC-GRAPPA implementations for synthesizing missing k-space data.
Figure 6:
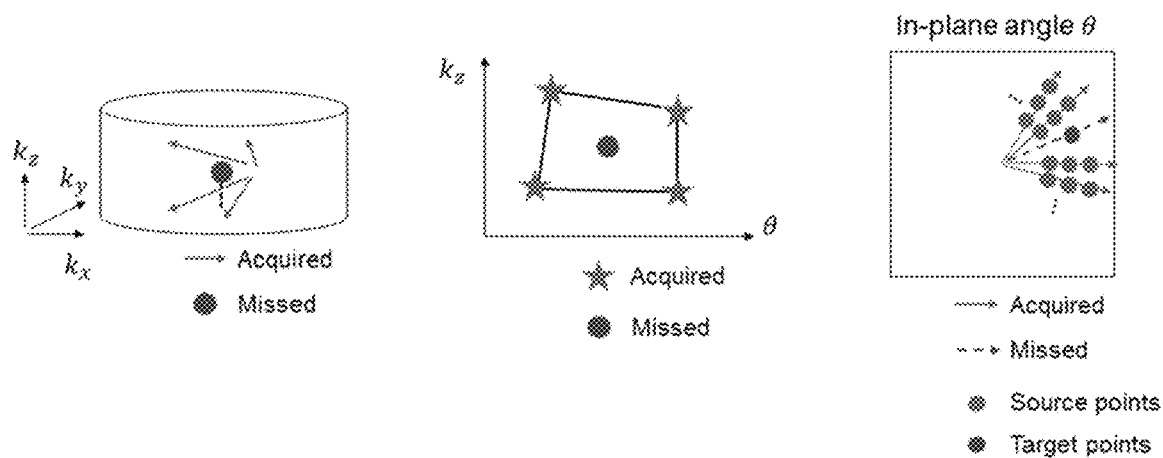
FIG. 6 illustrates an example 3D RIK geometry and its use for synthesizing missing k-space data.

In standard GRAPPA, a missing point is estimated with the summation of GRAPPA-kernel-weighted nearby acquired points. In VCC-GRAPPA with natural extension from GRAPPA, a missing point can be estimated with the summation of GRAPPA-kernel-weighted nearby acquired points and virtual points. Target-to-source relation of a kernel in GRAPPA and VCC-GRAPPA are illustrated in FIG. 5. In the left with GRAPPA, a missing point is reconstructed from the linear combination of a GRAPPA-kernel-weighted nearby acquired points. In the right with VCC-GRAPPA, an acquired spoke with angle θ+π is flipped to a virtual spoke with angle θ, which is inside the kernel patch determined in the left figure. The virtual spoke can be used as a source spoke for the reconstruction of the missing point, leading to shorter target-to-source distances than the one in the left figure. The VCC effect of reducing the target-to-source distance leads to stronger target-to-source correlations for potentially improved k-space reconstruction In 3D k-space reconstruction with 3D RIK for non-Cartesian acquisitions, a missing point is reconstructed from the linear combination of RIK-weighted acquired points in the local region. The local region can be defined as the $N_r$ nearest readout points across $N_p$ nearest spokes, as illustrated in FIG. 6. The RIK size in this example can be defined by $N_r \times N_p$. In the left, a 3D RIK geometry with $N_p$=4 is illustrated. On the surface of the cylinder, the missing spoke is located inside the kernel patch corresponding to these nearest spokes. In the middle, the coordinate system with slice-phase dimension $k_z$ and in-plane angle θ are shown. The corresponding location of the missing point is inside the patch formed by four nearest acquired spokes. In the right, the in-plane angle map shows that the four in-plane angles are the closest four angles to the one of the missing spoke.

In 3D k-space reconstruction with 3D RIK, the undersampling pattern in each local area corresponds to a 3D RIK with a distinct sampling pattern. This is similar to 2D imaging, where each undersampling region in non-Cartesian acquisition corresponds to a 2D RIK with distinct shape for RIK geometry. With the natural extension of SING to 3D k-space, target and source points on shift-invariant patterns with a distinct shape for each RIK geometry can be synthesized using the Cartesian ACS data in central k-space. In one example, the ACS data can be separately acquired. As another example, the ACS data can be generated from the combination of undersampled measurements throughout a dynamic period. The synthesized target and source points are then used to establish a linear overdetermined system. The system is then solved, such as via least-squares solution regularized by the local k-space regularization to obtain the coefficients of RIK. The RIK is subsequently convolved with the undersampled points in the local region corresponding to the RIK for the local k-space reconstruction. The synthesis of target and source points and solving linear system can be repeated until all missing points in k-space are fully reconstructed.

Figure 9:
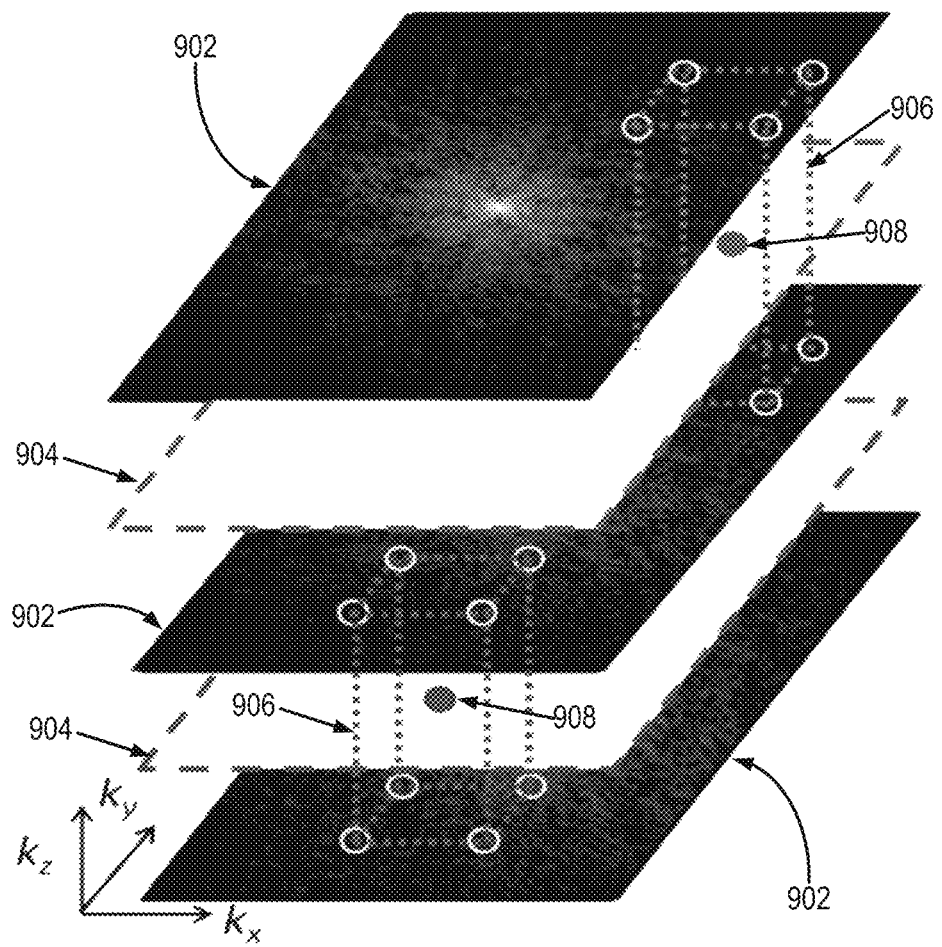
FIG. 9 shows an example of region-specific kernels for interpolating k-space data along the slice encoding direction, which can be calibrated using the SING techniques described in the present disclosure.

In some implementations, a RIK geometry such as the one shown in FIG. 9 can also be used. In general, region-specific kernels for reconstructing different parts of k-space can be estimated based on their slice encoding location. These kernels can be calibrated from corresponding regions of the calibration data (i.e., ACS data) or self-calibrated using the SING methods described in the present disclosure. By localizing the kernels further, better estimation of the interpolation kernels can be performed, leading to improved reconstruction quality.

FIG. 9 illustrates an example of k-space data 902 associated with three different acquired slice encoding locations and two missing slice locations. In this example, it is desired to recover or otherwise synthesize additional k-space data 904 at slice encoding locations that were not sampled during data acquisition. To achieve this, region-specific kernels 906 are estimated using calibration data (e.g., ACS data), which may be generated based on the self-calibration methods described in the present disclosure, and are applied to the k-space data 902 in order to estimate k-space points 908 to generate the additional k-space data 904. In this example, the k-space points shown as the yellow circles in the k-space data 902 contribute to estimating the synthesized k-space points 908 through application of the respective region-specific kernels 906.

In this example, region-specific 3D kernels in the slice encoding direction can be used to reconstruct images from undersampled k-space data. As one example, the slice encoding direction can be denoted by $k_z$, the readout direction can be denoted as $k_x$, and the phase-encoding direction can be denoted as $k_y$. It will be appreciated by those skilled in the art that the particular orientations can be interchanged (e.g., slice encoding can alternatively be carried out along the x-direction or the y-direction, which readout and phase-encoding along the other orthogonal axes). In order to estimate the missing k-space points ($k_z^{miss}$) at the slice encoding location, a unique kernel with elements, $w_{nj}^{k_z}$, of size $n_x \times n_y \times n_z \times n_{ch}$ is utilized to reconstruct the data in coil, j. This kernel can be calibrated using the SING methods described in the present disclosure.

Thus, as one non-limiting example, the RIKs can be 3D kernels that are shift-variant along the slice encoding direction and used to interpolate k-space along that direction. As another non-limiting example, the region-specific kernels can be 2D kernels that are shift-variant along the phase-encoding direction and used to interpolate k-space along that direction. A different kernel can be generated using a separate region of the calibration data, thereby resulting in multiple shift-variant kernels along the direction for which the kernels will be applied to interpolate additional k-space data. The kernel weights may be estimated as described above.

Figure 7:
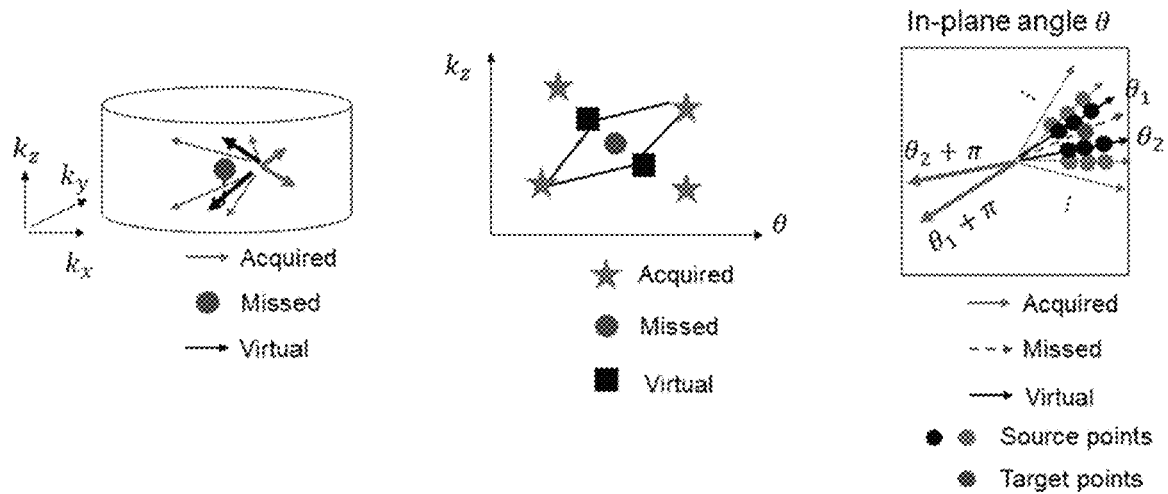
FIG. 7 illustrates an example 3D RIK geometry and its use for synthesizing missing k-space data using a VCC-SING approach.

SING, which as described above is a self-calibrated non-Cartesian GRAPPA reconstruction with region-specific interpolation kernel, uses target-to-source correlations generated by coil sensitivity encoding for k-space reconstruction. VCC can improve SING reconstruction by increasing the number of target-to-source correlations. The combination of VCC and SING can be referred to as VCC-SING. The geometry of a RIK when VCC is combined with SING is illustrated in FIG. 7. In the left, the same undersampling region shown in FIG. 6 is provided to illustrate the effect of VCC on the determination of RIK geometry. In the middle, the corresponding locations in the coordinate system ($k_z$, θ) show that two virtual spokes are closer to the missing point than two acquired spokes. In VCC-SING, the two virtual spokes can be chosen to replace two acquired spokes, which are more distance away from the missing spoke, as new source spokes. This makes the number of source spokes of SING and VCC-SING identical. In the right, the in-plane angle map for spokes shows that two virtual spokes with in-plane angles $\theta_1$ and $\theta_2$ are conjugate symmetric versions of two acquired spokes with in-plane angles $\theta_1+\pi$ and $\theta_2+\pi$. The inclusion of two virtual spokes can result in smaller in-plane angle differences between target and source spokes than the angle differences when VCC is not employed in SING. For RIK in VCC-SING, two virtual spokes and two acquired spokes that are nearest to the missing point can be used as the new set of source spokes. In another example the two virtual spokes can be chosen to be combined with the four acquired spokes, increasing the number of spokes in VCC-SING relative to SING.

Figure 8:
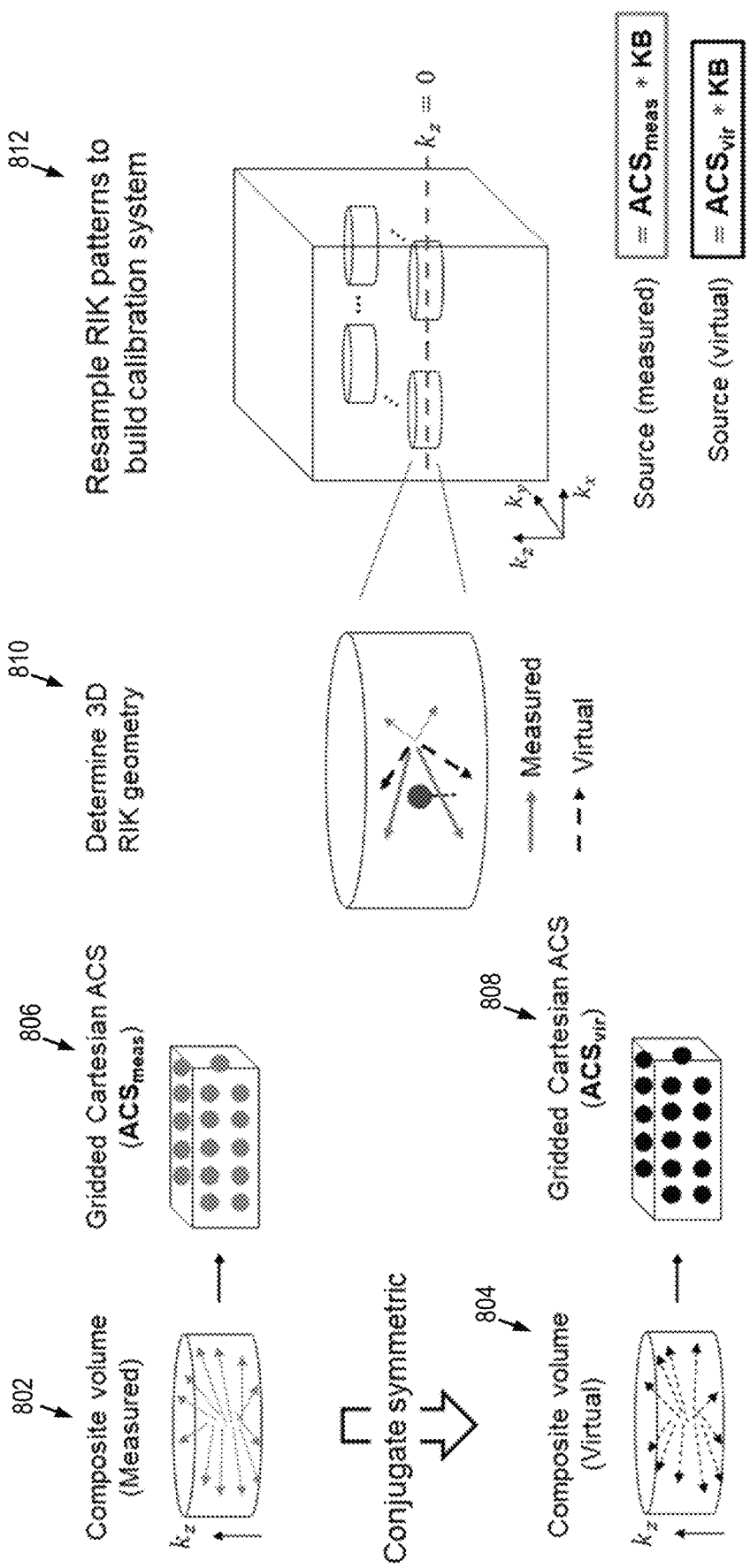
FIG. 8 shows a workflow of an example method for calibrating a RIK using a VCC-SING technique and using that RIK to synthesize missing k-space data.

Similar to SING, the VCC-SING synthesizes target and source points on shift-invariant sampling patterns with a distinct shape for each RIK geometry to establish a linear overdetermined system based on the shift-invariant property of GRAPPA interpolation kernels. An example of this synthesis process is illustrated in FIG. 8.

In this example, dynamic non-Cartesian measurements in each channel are combined, independently of other channels, into a composite volume with lower temporal resolution as shown at step 802. The conjugate symmetric of the composite volume in each channel is determined to obtain the virtual composite volume in each channel, as shown at step 804. The determination of conjugate symmetry can be performed by assigning negative signs on the sampled k-space coordinates ($k_x$, $k_y$, $k_z$) of the composite volume, followed by taking the conjugate of the complex-valued signal value of each measured sample in each channel of the composite volume. As shown at step 806, the composite non-Cartesian measurements in each channel are resampled, independently of other channels, onto Cartesian points, similar to gridding reconstruction. In some instances, this resampling may also include performing density compensation and convolution with a Kaiser-Bessel function of width $L=\Delta k$ ($\Delta k$ is Nyquist sampling interval in k-space). The same resampling operation is also applied on the virtual composite volume to obtain a distinct volume of Cartesian points, as shown at step 808. The two distinct Cartesian ACS volumes from steps 806 and 808 are used independently to resample target and source points with the resampling locations that match the sampling pattern for a RIK.

To extract one calibration equation, the target point can be synthesized by convolving the resampled Cartesian points generated from the non-Cartesian measurements with a Kaiser-Bessel function with width $L=\Delta k$. The resampling location of the target point matches the sampling pattern for the RIK. The source points are synthesized by convolving the same Kaiser-Bessel function with either the resampled Cartesian ACS volume generated from the non-Cartesian measurements or the other "virtual" Cartesian ACS volume generated from the non-Cartesian virtual data. The resampling locations of the source points match the sampling pattern for the RIK. The sampling pattern for the RIK, as an example illustrated at 810, includes two source spokes with the non-Cartesian measurements and the other two source spokes with the non-Cartesian virtual data. The source points on the two source spokes with the measured data are synthesized from the Kaiser-Bessel convolution of the Cartesian ACS volume generated from the non-Cartesian measurements. The other source points on the other two source spokes with the virtual data are synthesized from the Kaiser-Bessel convolution of the Cartesian ACS volume generated from the non-Cartesian virtual data. The same sampling pattern for the RIK is shifted along the $k_x$ and $k_y$ dimensions relative to the first sampling pattern by a distance $\beta \geq L$ over the ACS region around $k_z=0$, as shown at step 812.

Figure 10:
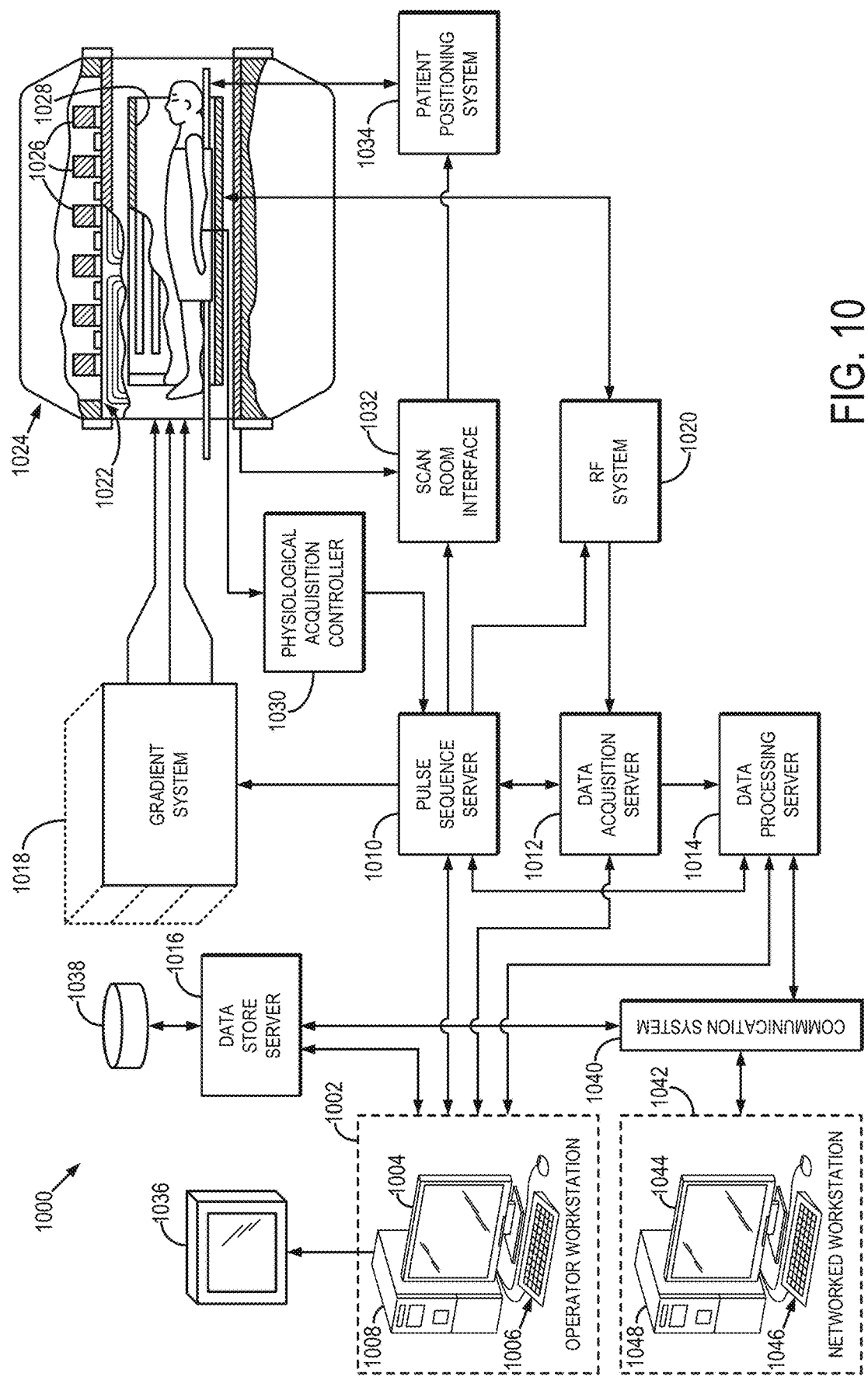
FIG. 10 is a block diagram of an example MRI system that can implement the methods described in the present disclosure.

Referring particularly now to FIG. 10, an example of an MRI system 1000 that can implement the methods described here is illustrated. The MRI system 1000 includes an operator workstation 1002 that may include a display 1004, one or more input devices 1006 (e.g., a keyboard, a mouse), and a processor 1008. The processor 1008 may include a commercially available programmable machine running a commercially available operating system. The operator workstation 1002 provides an operator interface that facilitates entering scan parameters into the MRI system 1000. The operator workstation 1002 may be coupled to different servers, including, for example, a pulse sequence server 1010, a data acquisition server 1012, a data processing server 1014, and a data store server 1016. The operator workstation 1002 and the servers 1010, 1012, 1014, and 1016 may be connected via a communication system 1040, which may include wired or wireless network connections.

The pulse sequence server 1010 functions in response to instructions provided by the operator workstation 1002 to operate a gradient system 1018 and a radiofrequency ("RF") system 1020. Gradient waveforms for performing a prescribed scan are produced and applied to the gradient system 1018, which then excites gradient coils in an assembly 1022 to produce the magnetic field gradients $G_x$, $G_y$, and $G_z$ that are used for spatially encoding magnetic resonance signals. The gradient coil assembly 1022 forms part of a magnet assembly 1024 that includes a polarizing magnet 1026 and a whole-body RF coil 1028.

RF waveforms are applied by the RF system 1020 to the RF coil 1028, or a separate local coil to perform the prescribed magnetic resonance pulse sequence. Responsive magnetic resonance signals detected by the RF coil 1028, or a separate local coil, are received by the RF system 1020. The responsive magnetic resonance signals may be amplified, demodulated, filtered, and digitized under direction of commands produced by the pulse sequence server 1010. The RF system 1020 includes an RF transmitter for producing a wide variety of RF pulses used in MRI pulse sequences. The RF transmitter is responsive to the prescribed scan and direction from the pulse sequence server 1010 to produce RF pulses of the desired frequency, phase, and pulse amplitude waveform. The generated RF pulses may be applied to the whole-body RF coil 1028 or to one or more local coils or coil arrays.

The RF system 1020 also includes one or more RF receiver channels. An RF receiver channel includes an RF preamplifier that amplifies the magnetic resonance signal received by the coil 1028 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \quad (8);$$

and the phase of the received magnetic resonance signal may also be determined according to the following relationship:

$$\varphi = \tan^{-1}\left(\frac{Q}{I}\right). \quad (9)$$

The pulse sequence server 1010 may receive patient data from a physiological acquisition controller 1030. By way of example, the physiological acquisition controller 1030 may receive signals from a number of different sensors connected to the patient, including electrocardiograph ("ECG") signals from electrodes, or respiratory signals from a respiratory bellows or other respiratory monitoring devices. These signals may be used by the pulse sequence server 1010 to synchronize, or "gate," the performance of the scan with the subject's heart beat or respiration.

The pulse sequence server 1010 may also connect to a scan room interface circuit 1032 that receives signals from various sensors associated with the condition of the patient and the magnet system. Through the scan room interface circuit 1032, a patient positioning system 1034 can receive commands to move the patient to desired positions during the scan.

The digitized magnetic resonance signal samples produced by the RF system 1020 are received by the data acquisition server 1012. The data acquisition server 1012 operates in response to instructions downloaded from the operator workstation 1002 to receive the real-time magnetic resonance data and provide buffer storage, so that data is not lost by data overrun. In some scans, the data acquisition server 1012 passes the acquired magnetic resonance data to the data processor server 1014. In scans that require information derived from acquired magnetic resonance data to control the further performance of the scan, the data acquisition server 1012 may be programmed to produce such information and convey it to the pulse sequence server 1010. For example, during pre-scans, magnetic resonance data may be acquired and used to calibrate the pulse sequence performed by the pulse sequence server 1010. As another example, navigator signals may be acquired and used to adjust the operating parameters of the RF system 1020 or the gradient system 1018, or to control the view order in which k-space is sampled. In still another example, the data acquisition server 1012 may also process magnetic resonance signals used to detect the arrival of a contrast agent in a magnetic resonance angiography ("MRA") scan. For example, the data acquisition server 1012 may acquire magnetic resonance data and processes it in real-time to produce information that is used to control the scan.

The data processing server 1014 receives magnetic resonance data from the data acquisition server 1012 and processes the magnetic resonance data in accordance with instructions provided by the operator workstation 1002. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 1014 are conveyed back to the operator workstation 1002 for storage. Real-time images may be stored in a data base memory cache, from which they may be output to operator display 1002 or a display 1036. Batch mode images or selected real time images may be stored in a host database on disc storage 1038. When such images have been reconstructed and transferred to storage, the data processing server 1014 may notify the data store server 1016 on the operator workstation 1002. The operator workstation 1002 may be used by an operator to archive the images, produce films, or send the images via a network to other facilities.

The MRI system 1000 may also include one or more networked workstations 1042. For example, a networked workstation 1042 may include a display 1044, one or more input devices 1046 (e.g., a keyboard, a mouse), and a processor 1048. The networked workstation 1042 may be located within the same facility as the operator workstation 1002, or in a different facility, such as a different healthcare institution or clinic.

The networked workstation 1042 may gain remote access to the data processing server 1014 or data store server 1016 via the communication system 1040. Accordingly, multiple networked workstations 1042 may have access to the data processing server 1014 and the data store server 1016. In this manner, magnetic resonance data, reconstructed images, or other data may be exchanged between the data processing server 1014 or the data store server 1016 and the networked workstations 1042, such that the data or images may be remotely processed by a networked workstation 1042.

Figure 11:
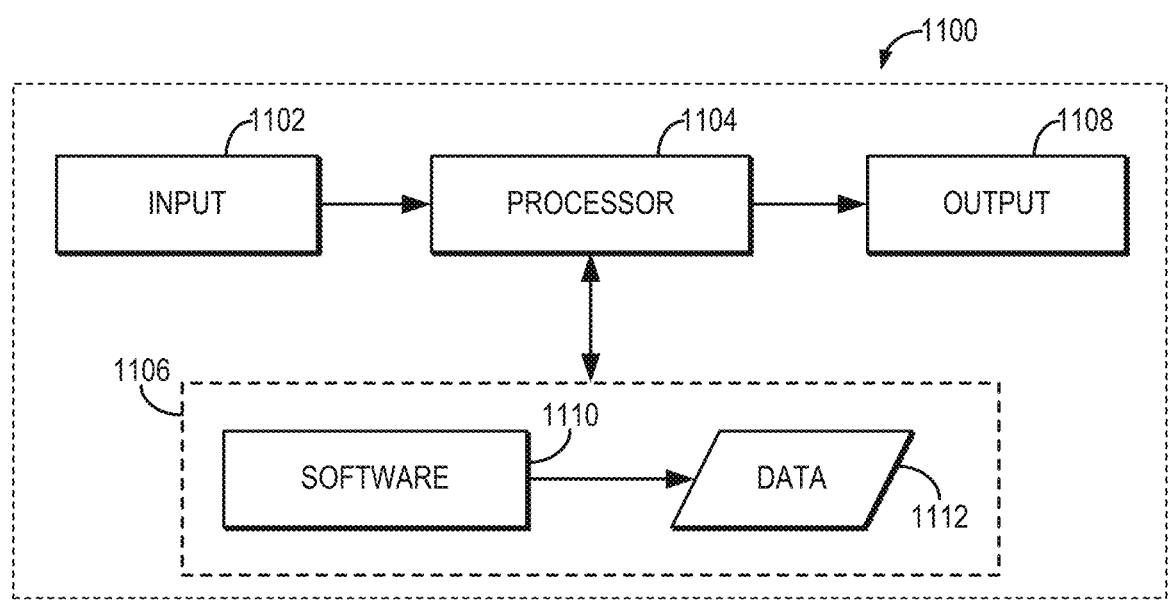
FIG. 11 is a block diagram of an example computer system that can implement the methods described in the present disclosure.

Referring now to FIG. 11, a block diagram of an example of a computer system 1100 that can perform the methods described in the present disclosure is shown. The computer system 1100 generally includes an input 1102, at least one hardware processor 1104, a memory 1106, and an output 1108. Thus, the computer system 1100 is generally implemented with a hardware processor 1104 and a memory 1106.

In some embodiments, the computer system 1100 can be a workstation, a notebook computer, a tablet device, a mobile device, a multimedia device, a network server, a mainframe, one or more controllers, one or more microcontrollers, or any other general-purpose or application-specific computing device.

The computer system 1100 may operate autonomously or semi-autonomously, or may read executable software instructions from the memory 1106 or a computer-readable medium (e.g., a hard drive, a CD-ROM, flash memory), or may receive instructions via the input 1102 from a user, or any another source logically connected to a computer or device, such as another networked computer or server. Thus, in some embodiments, the computer system 1100 can also include any suitable device for reading computer-readable storage media.

In general, the computer system 1100 is programmed or otherwise configured to implement the methods and algorithms described in the present disclosure. For instance, the computer system 1100 can be programmed to generate calibration data, compute region-specific reconstruction kernels, generate recovered k-space data, and reconstruct images as described.

The input 1102 may take any suitable shape or form, as desired, for operation of the computer system 1100, including the ability for selecting, entering, or otherwise specifying parameters consistent with performing tasks, processing data, or operating the computer system 1100. In some aspects, the input 1102 may be configured to receive data, such as data acquired with an MRI system. Such data may be processed as described above to generate calibration data, compute region-specific reconstruction kernels, generate recovered k-space data, and reconstruct images. In addition, the input 1102 may also be configured to receive any other data or information considered useful for implementing the methods described above.

Among the processing tasks for operating the computer system 1100, the one or more hardware processors 1104 may also be configured to carry out any number of post-processing steps on data received by way of the input 1102.

The memory 1106 may contain software 1110 and data 1112, such as data acquired with an MRI system, and may be configured for storage and retrieval of processed information, instructions, and data to be processed by the one or more hardware processors 1104. In some aspects, the software 1110 may contain instructions directed to generating calibration data, computing region-specific reconstruction kernels, generating recovered k-space data, and reconstructing images as described.

In addition, the output 1108 may take any shape or form, as desired, and may be configured for displaying reconstructed images, in addition to other desired information.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (e.g., hard disks, floppy disks), optical media (e.g., compact discs, digital video discs, Blu-ray discs), semiconductor media (e.g., random access memory ("RAM"), flash memory, electrically programmable read only memory ("EPROM"), electrically erasable programmable read only memory ("EEPROM")), any suitable media that is not fleeting or devoid of any semblance of permanence during transmission, and/or any suitable tangible media. As another example, transitory computer readable media can include signals on networks, in wires, conductors, optical fibers, circuits, or any suitable media that is fleeting and devoid of any semblance of permanence during transmission, and/or any suitable intangible media.

The present disclosure has described one or more preferred embodiments, and it should be appreciated that many equivalents, alternatives, variations, and modifications, aside from those expressly stated, are possible and within the scope of the invention.

The invention claimed is:

1. A method for producing an image of a subject with a magnetic resonance imaging (MRI) system, the steps of the method comprising:
   (a) acquiring undersampled k-space data with an MRI system using a radio frequency (RF) coil array having a plurality of coils, wherein the undersampled k-space data sample k-space along at least one non-Cartesian trajectory;
   (b) generating composite data from the undersampled k-space data;
   (c) generating regridded data from the composite data by regridding at least some of the composite data to a Cartesian grid;
   (d) determining a region-specific interpolation kernel (RIK) geometry;
   (e) generating calibration data from the regridded data by resampling the regridded data using the RIK geometry;
   (f) estimating reconstruction kernels from the calibration data; and
   (g) reconstructing an image of the subject from the undersampled k-space data using the computed reconstruction kernels to synthesize additional k-space data.

2. The method as recited in claim 1, wherein generating the regridded data comprises regridding all of the composite data.

3. The method as recited in claim 1, wherein generating the regridded data comprises regridding only a portion of the composite data.

4. The method as recited in claim 3, wherein the portion of the composite data consists of data associated with a central region of k-space.

5. The method as recited in claim 3, wherein the portion of the composite data excludes those composite data contained within a central region of k-space having a width equal to a width of a regridding function used to generate the regridded data.

6. The method as recited in claim 1, wherein the calibration data are generated by resampling the regridded data using non-overlapping patterns of the RIK geometry.

7. The method as recited in claim 1, wherein the calibration data are generated by resampling the regridded data using shifted copies of the RIK geometry.

8. The method as recited in claim 7, wherein the regridded data are generated in part using a Kaiser-Bessel function.

9. The method as recited in claim 8, wherein the shifted copies of the RIK geometry are shifted relative to one another by a shift value that is selected to be larger than a width of the Kaiser-Bessel function used when generating the regridded data.

10. The method as recited in claim 1, where in generating the composite data in step (b) includes reconstructing an initial image for each of the plurality of coils from the undersampled k-space data, combining the initial images to generate a composite image, and transforming the composite image into the composite data.

11. The method as recited in claim 10, wherein combining the initial images includes combining the initial images using a coil sensitivity weighted combination.

12. The method as recited in claim 1, wherein computing the reconstruction kernels in step (f) includes:
    forming a system of equations based on the undersampled k-space data and the calibration data; and
    solving the system of equations to compute the reconstruction kernels.

13. The method as recited in claim 12, wherein solving the system of equations includes using a regularization.

14. The method as recited in claim 13, wherein the regularization is implemented by adding noise points in the system of equations.

15. The method as recited in claim 14, wherein noise is added to synthetic points on each equation in order to match a signal-to-noise ratio (SNR) of the undersampled patch.

16. The method as recited in claim 14, wherein the noise is independent and identically distributed Gaussian noise.

17. The method as recited in claim 13, wherein the regularization is a Tikhonov regularization.

18. The method as recited in claim 1, wherein the undersampled k-space data are three-dimensional data.

19. The method as recited in claim 1, further comprising:
    generating virtual composite data by computing a conjugate symmetric of the composite data;
    generating virtual regridded data from the virtual composite data by regridding at least some of the virtual composite data to a Cartesian grid; and
    wherein generating the calibration data comprises generating the calibration data from both the regridded data and the virtual regridded data by resampling both the regridded data and the virtual regridded data using the RIK geometry.

20. The method as recited in claim 19, wherein computing the conjugate symmetric of the composite data comprises assigning negative signs on sampled k-space coordinates in the composite data and computing a conjugate of complex-valued signals at those sampled k-space coordinates.

21. The method as recited in claim 19, wherein generating the regridded data comprises regridding all of the composite data, and generating the virtual regridded data comprises regridding all of the virtual composite data.

22. The method as recited in claim 19, wherein generating the regridded data comprises regridding only a portion of the composite data, and generating the virtual regridded data comprises regridding a same portion of the virtual composite data.

23. The method as recited in claim 22, wherein the portion of the composite data and the same portion of the virtual composite data consists of data associated with a central region of k-space.

24. A method for producing an image of a subject with a magnetic resonance imaging (MRI) system, the steps of the method comprising:
    (a) acquiring undersampled k-space data with an MRI system using a radio frequency (RF) coil array having a plurality of coils;
    (b) determining a region-specific interpolation kernel (RIK) geometry;
    (c) generating calibration data using the RIK geometry;
    (d) estimating reconstruction kernels from the calibration data; and
    (e) reconstructing an image of the subject from the undersampled k-space data using the computed reconstruction kernels to synthesize additional k-space data.

25. The method as recited in claim 24, wherein the undersampled k-space data sample k-space along at least one Cartesian trajectory.

26. The method as recited in claim 25, wherein RIK geometry comprises one or more region-specific kernels that are shift-variant along a particular direction in k-space.

27. The method as recited in claim 26, wherein each region-specific kernel is a three-dimensional kernel.

28. The method as recited in claim 27, wherein the particular direction in k-space is the slice encoding direction.

29. The method as recited in claim 27, wherein each given reconstruction kernel is generated from a subset of the calibration data consisting of calibration data in a region local to that given reconstruction kernel.

30. The method as recited in claim 29, further comprising:
    generating virtual composite data by computing a conjugate symmetric of the composite data;
    generating virtual regridded data from the virtual composite data by regridding at least some of the virtual composite data to a Cartesian grid; and
    wherein generating the calibration data comprises generating the calibration data from both the regridded data and the virtual regridded data by resampling both the regridded data and the virtual regridded data using the RIK geometry.

31. The method as recited in claim 24, wherein the undersampled k-space data sample k-space using a random sampling on Cartesian points.

32. The method as recited in claim 24, wherein computing the reconstruction kernels in step (d) includes:
    forming a system of equations based on the undersampled k-space data and the calibration data; and
    solving the system of equations to compute the reconstruction kernels.

33. The method as recited in claim 32, wherein solving the system of equations includes using a regularization.

34. The method as recited in claim 33, wherein the regularization is implemented by adding noise to measurements in the system of equations.

35. The method as recited in claim 34, wherein noise is added to synthetic points on each equation in order to match a signal-to-noise ratio (SNR) of the undersampled patch.

36. The method as recited in claim 33, wherein the regularization for a RIK is implemented for a finite set of noise-levels from a lowest level to a highest level, and wherein the regularization for the reconstruction kernel is interpolated from these finite set of noise-levels.

* * * * *

UNITED STATES PATENT AND TRADEMARK OFFICE
CERTIFICATE OF CORRECTION

PATENT NO. : 11,231,475 B2
APPLICATION NO. : 16/853308
DATED : January 25, 2022
INVENTOR(S) : Steen Moeller et al.

It is certified that error appears in the above-identified patent and that said Letters Patent is hereby corrected as shown below:

In the Specification

Column 5, Line 29, "$a_m$" should be --$\alpha_m$--.

Column 5, Line 32, "U" should be --u--.

Signed and Sealed this
Nineteenth Day of April, 2022

Katherine Kelly Vidal
*Director of the United States Patent and Trademark Office*